United States Patent
Kakio et al.

(10) Patent No.: US 12,255,610 B2
(45) Date of Patent: Mar. 18, 2025

(54) SURFACE ACOUSTIC WAVE DEVICE

(71) Applicants: PIEZO STUDIO INC., Miyagi (JP); UNIVERSITY OF YAMANASHI, Yamanashi (JP)

(72) Inventors: Shoji Kakio, Yamanashi (JP); Noritoshi Kimura, Miyagi (JP)

(73) Assignees: PIEZO STUDIO INC., Miyagi (JP); UNIVERSITY OF YAMANASHI, Yamanashi (JP)

(*) Notice: Subject to any disclaimer, the term of this patent is extended or adjusted under 35 U.S.C. 154(b) by 267 days.

(21) Appl. No.: 17/903,757

(22) Filed: Sep. 6, 2022

(65) Prior Publication Data

US 2023/0071292 A1 Mar. 9, 2023

(30) Foreign Application Priority Data

Sep. 8, 2021 (JP) .................. 2021-146226

(51) Int. Cl.
*H03H 9/02* (2006.01)
*H03H 9/145* (2006.01)

(52) U.S. Cl.
CPC .... *H03H 9/02543* (2013.01); *H03H 9/14541* (2013.01)

(58) Field of Classification Search
CPC .......... H03H 9/02543; H03H 9/14541; H03H 9/02834
USPC ......................................... 333/133, 193–196
See application file for complete search history.

(56) References Cited

U.S. PATENT DOCUMENTS

2018/0323366 A1* 11/2018 Yoshikawa .......... H10N 30/872

FOREIGN PATENT DOCUMENTS

JP 4399587 B2 1/2010

* cited by examiner

*Primary Examiner* — Jorge L Salazar, Jr.
(74) *Attorney, Agent, or Firm* — WOMBLE BOND DICKINSON (US) LLP

(57) ABSTRACT

A surface acoustic wave device includes a piezoelectric substrate formed from a $Ca_3Ta(Ga_{1-x}Al_x)_3Si_2O_{14}$ single crystal, and an interdigital electrode formed on the surface of the piezoelectric substrate and formed from Al. The interdigital electrode is configured to generate a Love-wave-type SH wave on the surface of the piezoelectric substrate. A normalized film thickness obtained by dividing the film thickness of the interdigital electrode by the wavelength of the Love-wave-type SH wave is 0.16 or less.

2 Claims, 3 Drawing Sheets

SURFACE ACOUSTIC WAVE DEVICE

INCORPORATION BY REFERENCE

This application claims the benefit of foreign priority to Japanese Patent Application No. 2021-146226, filed Sep. 8, 2021, which is incorporated by reference in its entirety.

BACKGROUND OF THE INVENTION

The present invention relates to a surface acoustic wave device using a surface wave.

Surface acoustic wave devices using surface waves have been developed for use in, for example, the filter and signal source of a communication device such as a mobile phone by exploiting their characteristics such as small size, high reliability, high speed, and low power consumption. An example of the surface waves is the Love-wave-type SH (Shear-Horizontal) acoustic wave. The Love-wave-type SH wave has long been known as a surface wave that only exists in a specific propagation direction on a piezoelectric substrate and concentrates the energy of a bulk acoustic wave having only a shear wave component near the substrate surface by forming a metal film or a dielectric film on the piezoelectric substrate.

Japanese Patent No. 4399587 has proposed a technique of forming a piezoelectric substrate from a langasite (La3Ga5SiO14) crystal in a surface acoustic wave device using the above-mentioned the Love-wave-type SH wave. According to this technique, a langasite crystal substrate cut at a specific cut angle is used to implement a surface acoustic wave element having a temperature characteristic in which the temperature coefficient of the delay time is 0 or almost 0.

However, it is difficult for this technique to obtain a high-quality langasite crystal with high crystal uniformity. In addition, the langasite crystal uses rare earth element La, thus raises the material cost, and is disadvantageous for stable supply of a raw material.

SUMMARY OF THE INVENTION

It is an object of the present invention to provide a surface acoustic wave device using a Love-wave-type SH wave that is advantageous for stable supply of a raw material at low material cost.

According to one aspect of the present invention, there is provided a surface acoustic wave device including a piezoelectric substrate formed from a $Ca_3Ta(Ga_{1-x}Al_x)_3Si_2O_{14}$ single crystal, and an interdigital electrode formed on a surface of the piezoelectric substrate, formed from Al, and configured to generate a Love-wave-type SH wave on the surface of the piezoelectric substrate, wherein a normalized film thickness obtained by dividing a film thickness of the interdigital electrode by a wavelength of the Love-wave-type SH wave is not more than 0.16.

DESCRIPTION OF THE PREFERRED EMBODIMENTS

Figure 1:
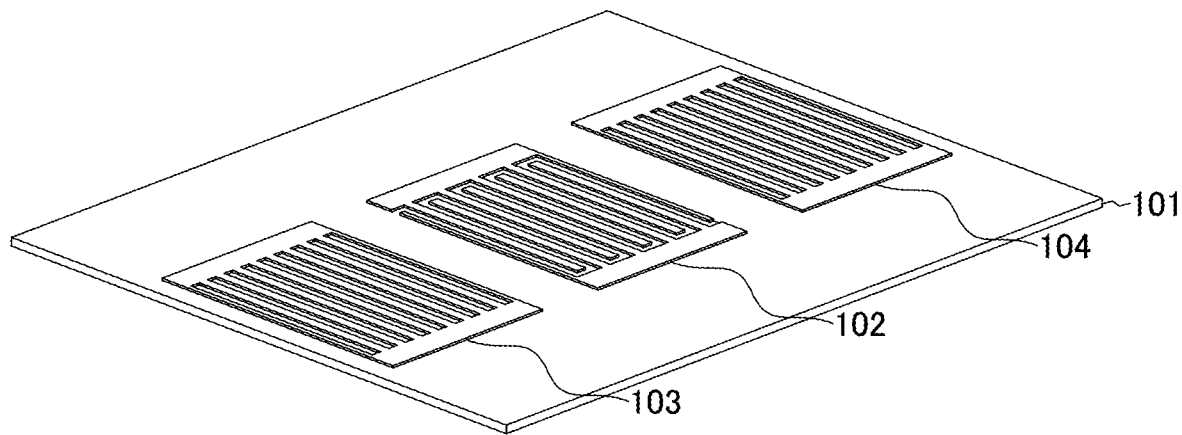
FIG. 1 is a perspective view of a surface acoustic wave device according to an embodiment of the present invention.

An embodiment of the present invention will be described below. A surface acoustic wave device shown in FIG. 1 includes a piezoelectric substrate 101 made of a single crystal of $Ca_3Ta(Ga_{1-x}Al_x)_3Si_2O_{14}$ (0≤x<1) [CTGS], and an interdigital electrode 102 that is formed on the surface of the piezoelectric substrate 101 and made of Al. The interdigital electrode 102 is configured to generate a Love-wave-type SH wave on the surface of the piezoelectric substrate 101.

The interdigital electrode 102 has a structure in which a plurality of positive electrode fingers and a plurality of negative electrode fingers are alternately arranged. A voltage is applied between the positive electrode fingers and the negative electrode fingers, generating the Love-wave-type SH wave on the surface of the piezoelectric substrate 101. The wavelength λ of the Love-wave-type SH wave is determined by the distance of one cycle of the electrode fingers (one cycle of the positive electrode finger and one cycle of the negative electrode finger). More specifically, the sum of the width of the positive electrode finger, the gap between the positive electrode finger and the negative electrode finger, the width of the negative electrode finger, and the gap between the negative electrode finger and the positive electrode finger is one wavelength (1λ). For example, if the widths of the electrode fingers and the gaps between the electrode fingers have the same sizes, all the widths and the gaps are λ/4.

It is preferable that the frequency of the Love-wave-type SH wave generated on the surface of the piezoelectric substrate 101 is constant regardless of the ambient temperature, in other words, the temperature coefficient of frequency (TCF) of the Love-wave-type SH wave is "0". As will be described later, the TCF of the Love-wave-type SH wave can be set to "0" by properly setting the film thickness of the interdigital electrode 102 and a cut angle from the single crystal of the piezoelectric substrate 101. In this embodiment, the film thickness of the interdigital electrode 102 is set within a range where there is a cut angle at which the TCF of the Love-wave-type SH wave generated on the surface of the piezoelectric substrate 101 becomes "0". More specifically, a normalized film thickness obtained by dividing the film thickness h of the interdigital electrode 102 by the wavelength λ of the Love-wave-type SH wave is 0.16 or less.

Figure 2:
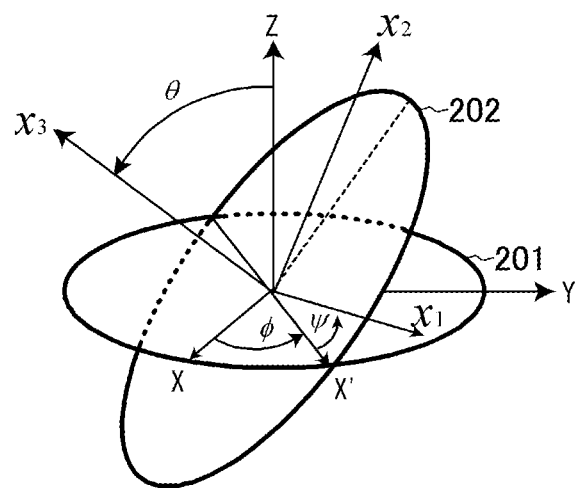
FIG. 2 is a view for explaining a cut angle.

When the cut angle of the piezoelectric substrate 101 from the $Ca_3Ta(Ga_{1-x}Al_x)_3Si_2O_{14}$ single crystal and the propagation direction (surface acoustic wave propagation direction) of the Love-wave-type SH wave are expressed as (φ, θ, ψ) in the Euler angle representation, they can be φ=−5° to 5°, θ=50° to 160°, and ψ=85° to 95° in consideration of the manufacturing error and the like. As shown in FIG. 2, the cut angle (second Euler angle) θ is the angle of a surface 202 of the fabricated piezoelectric substrate 101 with respect to a z-plane 201 of a reference crystal. Note that the cut angle has a notation method complying with the IEEE standard.

In this embodiment, an electrode (first electrode) 103 and an electrode (second electrode) 104 are formed on the surface of the piezoelectric substrate 101. The electrodes 103 and 104 are arranged to sandwich the interdigital electrode 102 in the propagation direction of the Love-wave-type SH wave. In other words, the electrode 103 is arranged on one side of the interdigital electrode 102, and the electrode 104 is arranged on the other side of the interdigital electrode 102. The electrodes 103 and 104 constitute a reflector. By providing the reflector in this manner, the surface acoustic wave device can function as a resonator. When the surface acoustic wave device is not used as a resonator, the electrodes 103 and 104 are unnecessary.

A surface acoustic wave device (resonator) was actually fabricated. The cut angle of a piezoelectric substrate 101 from the $Ca_3Ta(Ga_{1-x}Al_x)_3Si_2O_{14}$ single crystal was set to be (0°, 134°, 90°) in the Euler angle representation. An interdigital electrode 102 designed to generate the Love-wave-type SH wave having the wavelength λ=6.4 μm was fabricated on the piezoelectric substrate 101. The number N of electrode pairs of the interdigital electrode 102 was set to be N=100.5. One electrode pair is constituted by one positive electrode finger and one negative electrode finger. Hence, the number of electrode fingers was 201. The number $N_R$ of electrode pairs of the electrodes 103 and 104 constituting a reflector was set to be $N_R$=100.

The interdigital electrode 102 and the electrodes 103 and 104 in the above-described arrangement can be formed by, for example, forming an Al thin film on the piezoelectric substrate 101 using an electron beam deposition apparatus, and patterning the Al thin film by a known photolithography technique and etching technique.

The thickness of the Al thin film was set to be 0.355 μm. A normalized film thickness obtained by dividing the film thickness h of the interdigital electrode 102 by the wavelength λ of the Love-wave-type SH wave was h/λ≈0.055.

Figure 3:
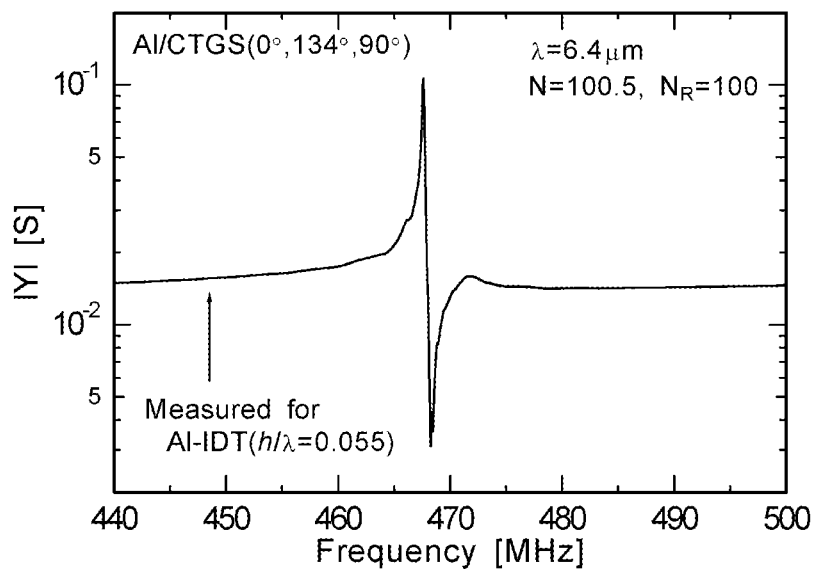
FIG. 3 is a graph showing the admittance characteristic of an actually fabricated surface acoustic wave device (resonator)

FIG. 3 shows the characteristic of the admittance (Y) of the fabricated surface acoustic wave device (resonator). An admittance ratio representing the difference between the admittance of resonance and that of antiresonance was 30.6 dB. The resonance Q was 2230.

Next, the TCF of the Love-wave-type SH wave generated on the surface of the piezoelectric substrate 101 will be described. In the surface acoustic wave device (resonator) fabricated in the above-described way, the frequency of the Love-wave-type SH wave at an ambient temperature of 30° C. was set as a reference frequency, and the TCF was measured by measuring a resonance frequency at an interval of 10° C. from 30° C. to 70° C. Note that the cut angle of the piezoelectric substrate 101 was (0°, 134°, 90°), the wavelength λ of the Love-wave-type SH wave=6.4 μm, the normalized film thickness h/λ of the interdigital electrode 102, ≈0.055, the number N of electrode pairs of the interdigital electrode 102, =100.5, and the number $N_R$ of electrode pairs of the electrodes 103 and 104, =100.

Figure 4:
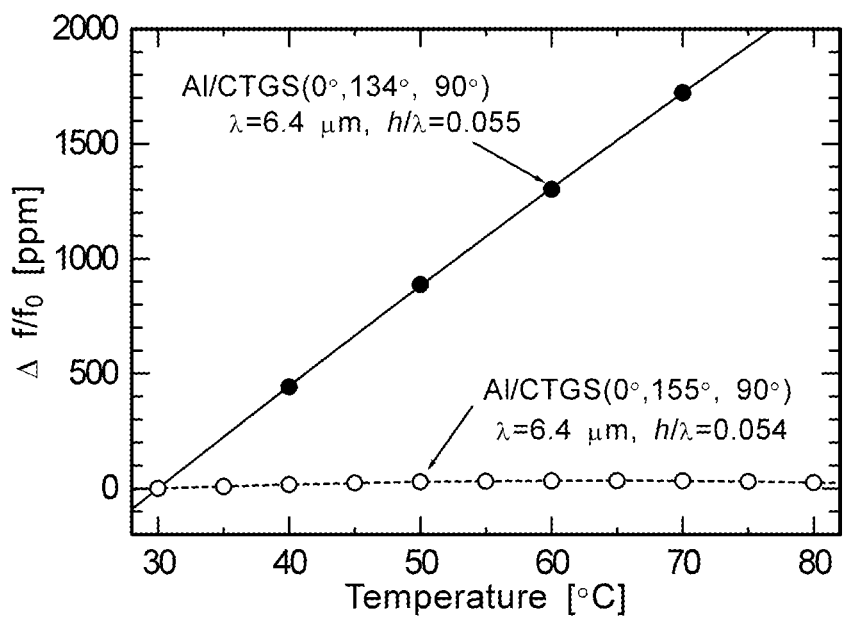
FIG. 4 is a graph showing the measurement result of the temperature coefficient of frequency (TCF) of the Love-wave-type SH wave generated on the surface of a piezoelectric substrate.

In FIG. 4, the solid line represents the measurement result of the TCF. The abscissa represents the ambient temperature [° C.], and the ordinate represents the rate Δf/$f_0$ [ppm] of change of the resonance frequency. $f_0$ is a resonance frequency at 30° C., and Δf is a difference between a resonance frequency at each temperature and the resonance frequency $f_0$ at 30° C. The slope of the solid line in FIG. 4 represents the TCF. As a result of the measurement, the TCF of the surface acoustic wave device in which the Al interdigital electrode 102 was formed on the piezoelectric substrate 101 was 43.5 ppm/° C.

Also, in FIG. 4, the dotted line represents the result of measuring the TCF at the cut angle (0°, 155°, 90°) of the piezoelectric substrate 101, the wavelength λ of the Love-wave-type SH wave, =6.4 μm, the normalized film thickness h/λ of the interdigital electrode 102, ≈0.054, the number N of electrode pairs of the interdigital electrode 102, =100.5, and the number $N_R$ of electrode pairs of the electrodes 103 and 104, =100. A frequency characteristic in which the TCF was almost "0" was obtained. It was experimentally verified that there was a cut angle at which the frequency of the surface acoustic wave device did not change even if the ambient temperature changed.

Figure 5:
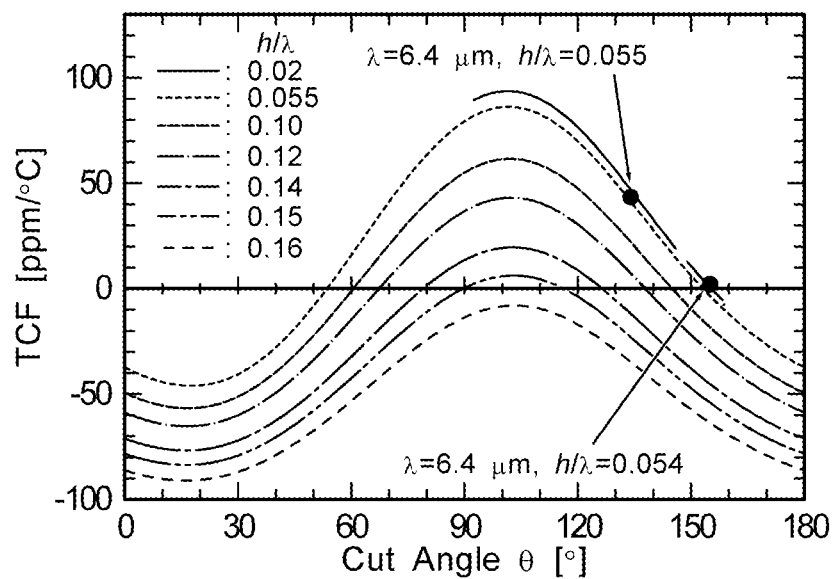
FIG. 5 is a graph showing a change of the TCF with respect to the cut angle of a piezoelectric substrate from a single crystal.

FIG. 5 shows a change of the TCF with respect to the cut angle of the piezoelectric substrate 101 from the single crystal. FIG. 5 reveals that when the normalized film thickness h/λ of the interdigital electrode 102 was 0.02 to 0.15, there was a cut angle within a range of 53° to 155° at which the TCF was "0", that is, the frequency of the Love-wave-type SH wave did not change even if the ambient temperature changed. Considering the accuracy (manufacturing error) of processing from a crystal to a wafer, and the like, the TCF becomes "0" around a cut angle of 50° to 160°.

However, as shown in FIG. 5, the maximum value of the curve of the TCF with respect to the cut angle changes in accordance with the film thickness of the interdigital electrode 102. As the film thickness of the interdigital electrode 102 increases, the maximum value decreases. If the film thickness of the interdigital electrode 102 is too large, the maximum value becomes smaller than TCF=0. This means that the TCF cannot be 0 regardless of the value of the cut angle of the piezoelectric substrate 101 from the single crystal.

To obtain a TCF of 0, it is necessary to set the film thickness of the interdigital electrode 102 within a range where there is a cut angle at which the TCF of the Love-wave-type SH wave generated on the surface of the piezoelectric substrate 101 becomes "0". From FIG. 5, the film thickness (normalized film thickness: h/λ) of the interdigital electrode 102 satisfying this condition is 0.15 or less, and considering the manufacturing error of formation of an Al thin film, 0.16 or less.

Figure 6:
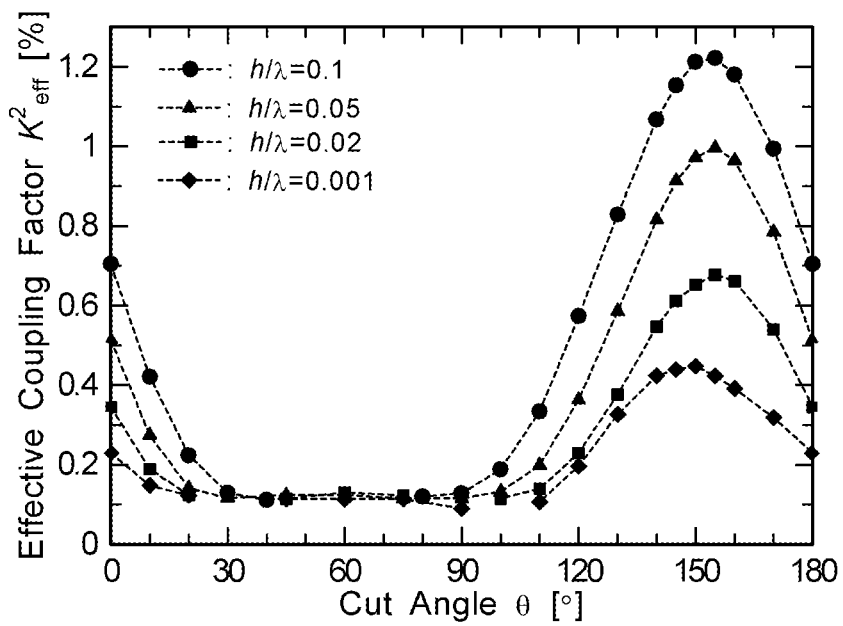
FIG. 6 is a graph showing the relationship between the cut angle of the piezoelectric substrate and an electromechanical coupling coefficient $K^2_{eff}$.

Next, the dependence of the electromechanical coupling coefficient on the cut angle of the piezoelectric substrate 101 will be explained. FIG. 6 shows the relationship between the cut angle (second Euler angle) θ of the piezoelectric substrate 101 and an electromechanical coupling coefficient $K^2_{eff}$ using the film thickness of the interdigital electrode 102 as a parameter. It was confirmed that the electromechanical coupling coefficient $K^2_{eff}$ was 0.1% or more and the Love-wave-type SH wave existed around a cut angle of 50° to 160° at which the TCF was "0", that is, the frequency did not change even if the ambient temperature changed. It was also revealed that the electromechanical coupling coefficient $K^2_{eff}$ became maximum at a cut angle of 140° to 160° though it differed depending on the film thickness of the interdigital electrode 102.

As described above, according to this embodiment, the Al interdigital electrode 102 is formed on the piezoelectric substrate 101 made of a $Ca_3Ta(Ga_{1-x}Al_x)_3Si_2O_{14}$ single crystal. The film thickness of the interdigital electrode 102 is set within a range where there is a cut angle of the piezoelectric substrate 101 from the single crystal at which the TCF of the Love-wave-type SH wave generated on the surface of the piezoelectric substrate 101 becomes "0". More specifically, the normalized film thickness h/λ of the interdigital electrode 102 is 0.16 or less. Hence, a surface acoustic wave device in which the TCF becomes "0" can be implemented without using a rare element such as La. There can be provided a surface acoustic wave device using the Love-wave-type SH wave that is advantageous for stable supply of a raw material at low material cost.

Note that the present invention is not limited to the above-described embodiment, and various modifications and combinations can be implemented by those skilled in the art without departing from the technical scope of the invention.

What is claimed is:

1. A surface acoustic wave device comprising:
    a piezoelectric substrate formed from a $Ca_3Ta(Ga_{1-x}Al_x)_3Si_2O_{14}$ ($0 \leq x < 1$) single crystal; and
    an interdigital electrode formed on a surface of the piezoelectric substrate, formed from Al, and configured to generate a Love-wave-type SH wave on the surface of the piezoelectric substrate,
    wherein a normalized film thickness obtained by dividing a film thickness of the interdigital electrode by a wavelength of the Love-wave-type SH wave is not more than 0.16, and
    wherein when a cut angle of the piezoelectric substrate from the single crystal and a propagation direction of the Love-wave-type SH wave are expressed as ($\phi$, $\theta$, $\psi$) in an Euler angle representation, $\phi=-5°$ to $5°$, $\theta=50°$ to $160°$, and $\psi=85°$ to $95°$.

2. The surface acoustic device according to claim 1, further comprising first and second electrodes formed on the surface of the piezoelectric substrate, arranged to sandwich the interdigital electrode in a propagation direction of the Love-wave-type SH wave, and constituting a reflector.

* * * * *